United States Patent
Bessho et al.

(12) 
(10) Patent No.: US 6,440,856 B1
(45) Date of Patent: Aug. 27, 2002

(54) CLEANING AGENT FOR SEMICONDUCTOR PARTS AND METHOD FOR CLEANING SEMICONDUCTOR PARTS

(75) Inventors: Keiichi Bessho, Ibaraki; Katsuhiro Ishikawa, Saitama; Hisao Ono, Tokyo; Makoto Higami, Ibaraki, all of (JP)

(73) Assignee: JSR Corporation, Tokyo (JP)

( * ) Notice: Subject to any disclaimer, the term of this patent is extended or adjusted under 35 U.S.C. 154(b) by 87 days.

(21) Appl. No.: 09/661,449

(22) Filed: Sep. 13, 2000

(30) Foreign Application Priority Data

Sep. 14, 1999 (JP) ............................................. 11-260848
Oct. 7, 1999 (JP) ............................................. 11-286439

(51) Int. Cl.$^7$ .......................................... H01L 21/302
(52) U.S. Cl. ....................... 438/691; 510/175; 510/176; 510/177; 438/638; 438/624; 438/690; 438/692
(58) Field of Search ................................. 438/638, 691, 438/624, 690, 692; 510/175, 176, 177, 444, 477; 428/447; 252/180, 389.2; 526/93

(56) References Cited

U.S. PATENT DOCUMENTS 4,659,793 A * 4/1987 Yang
5,076,957 A * 12/1991 Diehl et al.

* cited by examiner

*Primary Examiner*—Gregory E. Webb
(74) *Attorney, Agent, or Firm*—Oblon, Spivak, McClelland, Maier & Neustadt, P.C.

(57) ABSTRACT

Provided are a cleaning agent for semiconductor parts, which can decrease a load on the environment and has a high cleaning effect on CMP (chemical mechanical polishing) abrasive particles, metallic impurities and other impurities left on the semiconductor parts such as semiconductor substrates after the CMP, comprising a (co)polymer having at least one kind of group selected from the group consisting of sulfonic acid (salt) groups and carboxylic acid (salt) groups, the cleaning agent further containing a phosphonic acid (salt) group-containing (co)polymer, a phosphonic acid compound or a surfactant as needed; and a method for cleaning semiconductor parts with the above cleaning agent.

18 Claims, No Drawings

CLEANING AGENT FOR SEMICONDUCTOR PARTS AND METHOD FOR CLEANING SEMICONDUCTOR PARTS

FIELD OF THE INVENTION

The present invention relates to a cleaning agent for semiconductor parts and a method for cleaning the semiconductor parts, and more particularly to a cleaning agent used for cleaning surfaces of semiconductor parts such as semiconductor substrates, and a method for cleaning the semiconductor parts.

BACKGROUND OF THE INVENTION

As new planarization technology in the manufacturing processes of semiconductor devices, chemical mechanical polishing (CMP) has attracted attention. The CMP has the advantage of being able to shorten the steps and of being difficult to be affected by the pattern dependency to achieve good planarization, compared with conventional reflowing processes and etch back processes such as RIE (reactive ion etching). This type of CMP has been applied to, for example, metal planarization in multiple layers and planarization of interlayer insulation films.

As methods for cleaning substrate after the chemical mechanical polishing as the planarization process of interlayer insulation films, various methods have been proposed. Highest in versatility is RCA cleaning commonly used in the semiconductor manufacturing processes. The RCA cleaning comprises a cleaning step using a mixed solution of ammonia, aqueous hydrogen peroxide and water, and a cleaning step using a mixed solution of hydrochloric acid, aqueous hydrogen peroxide and water.

In etching surfaces of interlayer insulation films with diluted hydrofluoric acid, or in using alkali abrasives, methods of conducting acid cleaning are also proposed. It is most frequently used at present as the after treatment in the chemical mechanical polishing (CMP) process that after brush scrub cleaning, SC1 cleaning is carried out with, for example, an alkaline cleaning agent having an ammonia/hydrogen peroxide/water weight ratio of 1:1:5 to remove particles which have adhered to surfaces of substrates in the polishing process.

Further, for cleaning metallic impurities adsorbed by the surfaces of the substrates after CMP, it is known that an aqueous solution of citric acid is used, and further that an aqueous solution of citric acid or ethylenediaminetetraacetic acid (EDTA) is used together with hydrogen fluoride. Cleaning agents containing organic acids such as citric acid and complexing agents are also known in the art.

However, according to the above-mentioned cleaning agents, it is difficult to remove metallic impurities and abrasive particles left on the substrates after the chemical mechanical polishing, to a level at which no problem is encountered. For achieving an adequate cleaning effect, it is necessary to increase the concentration of the cleaning agents, which causes the problem of an increased load on the environment such as the liquid waste disposal.

SUMMARY OF THE INVENTION

It is therefore an object of the invention to provide a cleaning agent decreased in a load on the environment, and having a high cleaning effect on CMP (chemical mechanical polishing) abrasive particles such as silica and alumina, metallic impurities contained in the CMP slurry, or impurities such as Fe, Mn, Al, Ce, Cu, W and Ti derived from metallic wiring, which are left on semiconductor parts such as semiconductor substrates after the CMP.

Another object of the invention is to provide a method for cleaning semiconductor parts with the above-mentioned cleaning agent.

According to one aspect of the invention, there is provided a cleaning agent for semiconductor parts comprising a (co)polymer having at least one kind of group selected from the group consisting of sulfonic acid (salt) groups and carboxylic acid (salt) groups.

The above-mentioned (co)polymer is preferably one obtained by (co)polymerizing at least one kind of monomer selected from the group consisting of sulfonic acid (salt) group-containing monomers (a) and carboxylic acid (salt) group-containing monomers (b).

Further, the above-mentioned sulfonic acid (salt) group-containing monomer (a) is preferably at least one kind of monomer selected from the group consisting of 2-methyl-1,3-butadiene-1-sulfonic acid and salts thereof, and (meth) acrylamido-2-methylpropanesulfonic acid and salts thereof.

Still further, the above-mentioned carboxylic acid (salt) group-containing monomer (b) is preferably itaconic acid or a salt thereof.

Yet still further, the ratio of the carboxylic acid group-containing monomer (b) contained in the above-mentioned (co)polymer is preferably less than 20 mole percent.

Furthermore, the above-mentioned (co)polymer is preferably a copolymer having a block structure.

Moreover, it is preferred that the above-mentioned (co)polymer comprises a (co)polymer in which at least one kind of monomer (c) selected from the group consisting of phosphonic acid (salt) group-containing monomers, hydroxyl group-containing monomers, monomers having skeletons derived from ethylene oxide and monomers having skeletons derived from propylene oxide is copolymerized.

The above-mentioned cleaning agent for semiconductor parts preferably contains a phosphonic acid compound.

In addition, it is preferred that the above-mentioned cleaning agent for semiconductor parts contains at least one kind of surfactant selected from the group consisting of anionic surfactants, cationic surfactants and nonionic surfactants.

The above-mentioned cleaning agent for semiconductor parts is preferably used for cleaning the semiconductor parts before and/or after chemical mechanical polishing.

According to the other aspect of the invention, there is provided a method for cleaning semiconductor parts comprising cleaning the semiconductor parts with the above-mentioned cleaning agent.

DETAILED DESCRIPTION OF THE INVENTION

The (co)polymer contained in the cleaning agent for semiconductor parts of the invention and having at least one kind of group selected from the group consisting of sulfonic acid (salt) groups and carboxylic acid (salt) groups can be obtained by, for example, (co)polymerizing at least one kind of monomer selected from the group consisting of sulfonic acid (salt) group-containing monomers (a) and carboxylic acid (salt) group-containing monomers (b). The term "sulfonic acid (salt) group" as used herein means a sulfonic acid group or a salt thereof in which a cationic species is coordinated to the sulfonic acid. Similarly, the term "carboxylic acid (salt) group" as used herein means a carboxylic acid group or a salt thereof in which a cationic species is coordinated to the carboxylic acid, and the term "phosphonic acid (salt) group" as used herein means a phosphonic acid group or a salt thereof in which a cationic species is coordinated to the phosphonic acid.

The (co)polymer of the invention may be any of a sulfonic acid (salt) group-containing (co)polymer, a carboxylic acid (salt) group-containing (co)polymer and a sulfonic acid (salt) group and carboxylic acid (salt) group-containing (co)polymer, and may be a combination of these (co)polymers.

Further, the (co)polymer of the invention includes a (co)polymer salt in which a sulfonic acid group or a carboxylic acid group forms a salt. Therefore the (co)polymer or a salt thereof is also referred to a "(co)polymer (salt)".

There is no particular limitation on the sulfonic acid (salt) group-containing monomers (a), as long as they are monomers containing sulfonic acid (salt) groups and having polymerizable double bonds. Examples of the monomers (a) include 2-methyl-1,3-butadiene-1-sulfonic acid and salts thereof; (meth)acrylamido-2-methylpropanesulfonic acid and salts thereof; sulfonic acids of conjugated dienes represented by the following general formula (I) and salts thereof (for example, 2-methyl-1,3-butadiene-1-sulfonic acid and salts thereof):

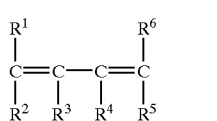

(I)

wherein $R^1$ to $R^6$ are hydrogen atoms, alkyl groups each having 1 to 8 carbon atoms, aryl groups each having 6 to 20 carbon atoms or $-SO_3X$, wherein X is a hydrogen atom, a metal atom, an ammonium group or an amino group, and at least one of $R^1$ to $R^6$ is $-SO_3X$; unsaturated (meth)allyl ether sulfonic acids represented by the following general formula (II) and salts thereof (for example, 3-allyloxy-2-hydroxypropanesulfonic acid and salts thereof, and 3-methallyloxy-2-hydroxypropanesulfonic acid and salts thereof):

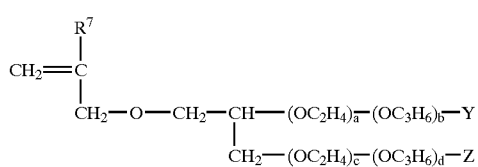

(II)

wherein $R^7$ is a hydrogen atom or an alkyl group having 1 to 8 carbon atoms, a to d, which may be the same or different, represent 0 or integers of 1 to 100 (with the proviso that a+b+c+d=0 to 100), an $(OC_2H_4)$ unit and an $(OC_3H_6)$ unit are combined in any order, Y and Z are sulfonic acid groups or hydroxyl groups, and at least one of Y and Z is a sulfonic acid group; 2-hydroxy-3-acrylamidopropanesulfonic acid and salts thereof; styrenesulfonic acid and salts thereof; methallylsulfonic acid and salts thereof; vinylsulfonic acid and salts thereof; allylsulfonic acid and salts thereof; and isoamylenesulfonic acid and salts thereof. Preferred are 2-methyl-1,3-butadiene-1-sulfonic acid and salts thereof, (meth)acrylamido-2-methylpropanesulfonic acid and salts thereof, 3-allyloxy-2-hydroxypropanesulfonic acid and salts thereof, and styrenesulfonic acid and salts thereof. More preferred are 2-methyl-1,3-butadiene-1-sulfonic acid and salts thereof, and (meth)acrylamido-2-methylpropanesulfonic acid and salts thereof.

The sulfonic acid (salt) group-containing monomers (a) can be used either alone or as a mixture of two or more of them.

There is no particular limitation on the carboxylic acid (salt) group-containing monomers (b), as long as they are monomers containing carboxylic acid (salt) groups and having polymerizable double bonds. Examples of the monomers (b) include acrylic acid, methacrylic acid, α-haloacrylic acids, maleic acid, maleic anhydride, itaconic acid, itaconic anhydride, vinylacetic acid, allylacetic acid, fumaric acid, fumaric anhydride, citraconic acid, citraconic anhydride, glutaconic acid, phosphinocarboxylic acids, β-carboxylic acids and salts thereof; and alkyl (meth)acrylates such as methyl (meth)acrylate, ethyl (meth)acrylate and octyl (meth) acrylate. Preferred are acrylic acid, methacrylic acid, itaconic acid, itaconic anhydride and salt thereof. More preferred are acrylic acid, itaconic acid and salts thereof.

The carboxylic acid (salt) group-containing monomers (b) can be used either alone or as a mixture of two or more of them.

The (co)polymer of the invention is preferably the sulfonic acid (salt) group-containing polymer or the sulfonic acid (salt) group and carboxylic acid (salt) group-containing copolymer, more preferably the sulfonic acid (salt) group and carboxylic acid (salt) group-containing copolymer.

In the sulfonic acid (salt) group and carboxylic acid (salt) group-containing copolymer, the amount of the sulfonic acid (salt) group-containing monomer (a) used is from 2 mole percent to 80 mole percent, preferably from 5 mole percent to 50 mole percent, and more preferably from 10 mole percent to 35 mole percent, based on the monomer components. The amount of the carboxylic acid (salt) group-containing monomer (b) used is from 20 mole percent to 98 mole percent, preferably from 50 mole percent to 95 mole percent, and more preferably from 65 mole percent to 90 mole percent.

The (co)polymer comprising the monomers (a) and (b) may further contains a (co)polymer in which at least one kind of monomer (c) selected from the group consisting of phosphonic acid (salt) group-containing monomers, hydroxyl group-containing monomers, monomers having skeletons derived from ethylene oxide and monomers having skeletons derived from propylene oxide is copolymerized.

When the (co)polymer comprising the monomers (a) and (b) is produced, the above-mentioned monomer (c) may be copolymerized therewith.

Of the monomers (c), the phosphonic acid (salt) group-containing monomers include vinylphosphonic acid and salts thereof, which can be used either alone or as a combination of two or more of them.

The amount of vinylphosphonic acid (salt) used is preferably from 5% to 50% by weight, and more preferably from 10% to 30% by weight, based on the total of the monomers (a) to (c) used in the cleaning agent of the invention. Less than 5% by weight sometimes unfavorably leads to a reduction in metal (ion) removal ability when the (co)polymer is used as the cleaning agent. On the other hand, exceeding 50% by weight results in failure to obtain an effect reflecting it, not economically.

The composition of the monomer components of the invention is preferably monomer (a), monomer (a)

/monomer (b), monomer (a)/vinylphosphonic acid (salt), monomer (b)/vinylphosphonic acid (salt), or monomer (a)/ monomer (b)/vinylphosphonic acid (salt).

Of the monomers (c), the hydroxyl group-containing monomers include, for example, unsaturated alcohols such as vinyl alcohol, allyl alcohol, methylvinyl alcohol, ethylvinyl alcohol and vinylglycolic acid; and hydroxyl group-containing (meth)acrylates such as hydroxymethyl (meth) acrylate, hydroxyethyl (meth)acrylate, hydroxypropyl (meth)acrylate, polyethylene glycol mono(meth)acrylate, polypropylene glycol mono(meth)acrylate, glycerol mono (meth)acrylate, glycerol di(meth)acrylate, polytetramethylene glycol mono(meth)acrylate, polytetramethylene glycol di(meth)acrylate, butanediol mono (meth)acrylate, hexanediol mono (meth)acrylate, pentaerythritol mono(meth) acrylate and hydroxyphenoxyethyl (meth)acrylate. Preferred is hydroxyethyl methacrylate.

Of the monomers (c), the monomers having skeletons derived from ethylene oxide or propylene oxide include polyoxyethylene monomethacrylate (1- to 10-mole adduct of ethylene oxide); and compounds having the structure represented by the following general formula (III):

$$CH_2=CR^8-COO-(AO)-R^9 \qquad (III)$$

Wherein $R^8$ is a hydrogen atom or a methyl group; $R^9$ is an aliphatic group having 1 to 18 carbon atoms or an aromatic group; and A is a methylene group, a propylene group or tetramethylene group. Preferred is polyoxyethylene monomethacrylate (5-mole adduct of ethylene oxide).

The monomer (c) other than vinylphosphonic acid (salt) described above is used preferably in an amount of 5% to 50% by weight, and more preferably in an amount of 10% to 30% by weight, based on the total of the monomers (a) to (c) used in the cleaning agent of the invention. Less than 5% by weight sometimes unfavorably leads to a reduction in cleaning ability, whereas exceeding 50% by weight results in failure to obtain an effect reflecting it, not economically.

In the (co)polymer of the invention, in addition to the monomers (a) to (c), one or more kinds of other monomers copolymerizable therewith may be further copolymerized. Further, the (co)polymer of the invention may be used with a (co)polymer obtained by (co)polymerizing one or more kinds of other copolymerizable monomers.

The other copolymerizable monomers include aromatic vinyl compounds such as styrene, α-methylstyrene, vinyltoluene and p-methylstyrene; aliphatic conjugated dienes such as butadiene, 2-methyl-1,3-butadiene, 2-chloro-1,3-butadiene and 1-chloro-1,3-butadiene; vinyl cyanide compounds such as (meth)acrylonitrile; amine compounds; amide compounds such as acrylamide, methacrylamide and alkyl(meth)acrylamides; and phosphoric acid compounds.

When the other monomers other than the above-mentioned monomers (a) to (c) are used, they are preferably used in an amount of 30 mole percent, based on the total of the monomers (a) to (c) used in the cleaning agent of the invention.

Methods for producing the (co)polymers of the invention by (co)polymerizing the monomer components containing the monomers (a) to (c) are, for example, as follows.

That is to say, the above-mentioned monomer components can be polymerized at a reaction temperature of usually 20° C. to 200° C., preferably 40° C. to 150° C., for 0.1 hour to 20 hours, preferably for 1 hour to 15 hours, in the presence of a known polymerization initiator such as hydrogen peroxide, sodium persulfate or potassium persulfate, to produce the (co)polymer. As one formulation, the monomer components used in the polymerization can be successively added to conduct the polymerization. The term "successive polymerization" as used herein means polymerization in which the monomer components are put into a polymerization system within a specified period of time, at a constant amount per unit time or changing an amount added.

In the above-mentioned (co)polymerization reaction, polymerization solvents can be used for smoothly conducting the reaction. The polymerization solvents, which can be used, include water and mixtures of water and organic solvents miscible with water. There is no particular limitation on the organic solvents, as long as they are miscible with water, and specific examples thereof include tetrahydrofuran, 1,4-dioxane and alcohols.

Further, the weight average molecular weight of the above-mentioned (co)polymers used in the invention is from 1,000 to 500,000, preferably from 3,000 to 300,000, and more preferably from 5,000 to 300,000. Less than 1,000 sometimes leads to insufficient exhibition of cleaning ability, whereas exceeding 500,000 causes gelation to make handling difficult.

The (co)polymers of the invention thus obtained are preferably water-soluble. For making them water-soluble, counter ions of cationic species may be coordinated to the sulfonic acid groups, the carboxylic acid groups and phosphonic acid groups contained in the (co)polymers to form salts of the (co)polymers. Although there is no particular limitation on the cationic species for making the (co) polymers water-soluble, hydrogen, alkali metals, alkaline earth metals, ammonium and amines are preferred. Examples of the alkali metals include sodium and potassium. Examples of the amines include alkylamines such as methylamine, ethylamine, propylamine, dimethylamine, diethylamine, triethylamine, butylamine, dibutylamine and tributylamine; polyamines such as ethylenediamine, diethylenetriamine and triethylene-tetramine; morpholine and piperidine. And examples of the alkaline earth metals include calcium and magnesium. Preferred are hydrogen, potassium, ammonium and alkylamines.

For obtaining the salts of the (co)polymers having these cationic species, monomers having the preferred cationic species may be (co)polymerized, or acid type monomers may be (co)polymerized, followed by neutralization with corresponding alkalis. It is also possible to mutually exchange the salts of the (co)polymers with other cationic species by various ion exchange techniques. These cationic species can be used either alone or as a combination of two or more of them.

Of the (co)polymers of the invention, the sulfonic acid (salt) group-containing (co)polymer is obtained by, for example, sulfonating all or partially aromatic rings or residual double bonds of a base polymer (precursor) having a diene structure or an aromatic structure, or hydrogenating all or partially the diene structure, followed by sulfonation. In this case, known hydrogenation catalysts can be used. For example, hydrogenation catalysts and hydrogenation methods as described in Toku-Kai-Hei (Japanese Patent Unexamined Publication) 5-222115 can be used. After hydrogenation, the base polymer can also be sulfonated by a method described later. However, the base polymer may be hydrogenated after sulfonation without any problem at all.

There is no particular limitation on the base polymers used in the invention, and either random type copolymers or block type (AB type or ABA type) copolymers can be used. When the block type copolymers are used as the base polymers, sulfonic acid (salt) group-containing copolymers having a block structure are obtained. For example, in a styrene-2-methyl-1,3-butadiene binary block copolymer, 2-methyl- 1,3-butadiene units can be preferentially sulfonated by using a sulfuric anhydride/a electron-donating compound described later. Further, after the 2-methyl-1,3-butadiene units of the styrene-2-methyl-1,3-butadiene block copolymer have been hydrogenated, aromatic rings derived from styrene in the hydrogenated copolymer are preferentially sulfonated with sulfuric anhydride, thereby obtaining a copolymer having sulfonic acid (salt) group blocks and hydrophobic blocks.

Preferred examples of the base polymers include polymers of aromatic monomers such as polystyrene, a 2-methyl-1,3-butadiene homopolymer, butadiene homopolymer, a 2-methyl-1,3-butadiene-styrene random copolymer, a 2-methyl-1,3-butadiene-styrene block copolymer, a styrene-2-methyl-1,3-butadiene-styrene ternary block copolymer, a butadiene-styrene random copolymer, a butadiene-styrene block copolymer, a styrene-butadiene- styrene block copolymer, hydrogenated products of these (co)polymers, and a ethylene-propylene-diene ternary copolymer. Preferred are the polymers of aromatic monomers and aromatic monomer-diene block copolymers. More preferred are polystyrene, the 2-methyl-1,3-butadiene-styrene random copolymer, the 2-methyl-1,3-butadiene-styrene block copolymer and the hydrogenated products thereof.

The sulfonic acid (salt) group-containing (co)polymers of the invention are obtained by sulfonating the above-mentioned base polymers (precursors) by known methods, for example, methods described in *Shin Jikken Kagaku Koza* (New Chemical Experimentation Course) edited by The Chemical Society of Japan, Vol. 14, III, 1, page 773, or Toku-Kai-Hei (Japanese Patent Unexamined Publication) 2-227403.

That is to say, double bond moieties in the above-mentioned base polymers can be sulfonated with sulfonating agents. In the sulfonation, the double bonds are opened to form single bonds, or hydrogen atoms are substituted by sulfonic acid (salt) groups, keeping the double bonds left. When other monomers are used, double bond moieties other than diene units, for example, aromatic units, may be sulfonated.

Preferred examples of the sulfonating agents used in this case include sulfuric acid, chlorosulfonic acid, fuming sulfuric acid and hydrogensulfites (Na, K and Li salts), as well as sulfuric anhydride and complexes of sulfuric anhydride and electron-donating compounds.

The electron-donating compounds used herein include ethers such as N,N-dimethylformamide, dioxane, dibutyl ether, tetrahydrofuran and diethyl ether; amines such as pyridine, piperazine, trimethylamine, triethylamine and tributylamine; sulfides such as dimethyl sulfide and diethyl sulfide; and nitrile compounds such as acetonitrile, ethylnitrile and propylnitrile. Of these, N,N-dimethylformamide and dioxane are preferred.

The amount of the sulfonating agent is usually from 0.2 mole to 2.0 moles, and preferably from 0.3 mole to 1.2 moles, in terms of sulfuric anhydride, per mole of diene unit in the base polymer. Less than 0.2 mole results in difficulty to obtain the sulfonic acid (salt) group-containing (co) polymer. Whereas exceeding 2.0 moles, the amount of the unreacted sulfonating agent such as sulfuric anhydride unfavorably increases to produce sulfates in large amounts after alkali neutralization, resulting in a reduction in purity of the product.

In the sulfonation, solvents inactive on the sulfonating agents such as sulfuric anhydride can also be used. Examples of the solvents include halogenated hydrocarbons such as chloroform, dichloroethane, tetrachloroethane, tetrachloroethylene and dichloromethane; nitro compounds such as nitromethane and nitrobenzene; liquid sulfur dioxide; and aliphatic hydrocarbons such as propane, butane, pentane, hexane and cyclohexane.

These solvents can be used either alone or as a mixture of two or more of them.

The reaction temperature of the sulfonation is usually from −70° C. to +200° C., and preferably from −30° C. to +50° C. Less than −70° C. results in retarded sulfonation reaction, not economically. On the other hand, exceeding +200° C. unfavorably causes side reactions to blacken or insolubilize a product in some cases.

Thus, an intermediate in which the sulfonating agent such as sulfuric anhydride is combined with the base polymer (a sulfonate of the base polymer, hereinafter referred to as "an intermediate") is formed.

The sulfonic acid (salt) group-containing (co)polymer of the invention is obtained by allowing water or a basic compound to act on the intermediate. In that case, the double bonds are opened to form single bonds with which sulfonic acid (salt) groups are combined, or hydrogen atoms are substituted by sulfonic acid (salt) groups, keeping the double bonds left.

The basic compounds include alkali metal hydroxides such as sodium hydroxide, potassium hydroxide and lithium hydroxide; alkali metal alkoxides such as sodium methoxide, sodium ethoxide, potassium methoxide, sodium t-butoxide and potassium t-butoxide; carbonates such as sodium carbonate, potassium carbonate and lithium carbonate; organic metal compounds such as methyllithium, ethyllithium, n-butyllithium, sec-butyllithium, amyllithium, propylsodium, methylmagnesium chloride, ethylmagnesium bromide, propylmagnesium iodide, diethylmagnesium, diethylzinc, triethylaluminum and triisobutylaluminum; amines such as aqueous ammonia, trimethylamine, triethylamine, tripropylamine, tributylamine, pyridine, aniline and piperazine; and metal compounds such as sodium compounds, lithium compounds, potassium compounds, calcium compounds and zinc compounds.

These basic compounds can be used either alone or as a combination of two or more of them.

Of these basic compounds, the alkali metal hydroxides and aqueous ammonia are preferred, and sodium hydroxide and lithium hydroxide are particularly preferred.

The amount of the basic compound used is 2 moles or less, and preferably 1.3 moles or less, per mole of sulfonating agent used. Exceeding 2 moles, the amount of the unreacted basic compound unfavorably increases, resulting a reduction in purity of a product.

When the intermediates are reacted with the basic compounds, the basic compounds can be used in aqueous solution form, or as solutions form in which the above-mentioned basic compounds are dissolved in inactive organic solvents thereon.

The inactive organic solvents include aromatic hydrocarbon compounds such as benzene, toluene and xylene; and alcohols such as methanol, ethanol, propanol, isopropanol and ethylene glycol, as well as the above-mentioned various organic solvents. These solvents can be used either alone or as a mixture of two or more of them.

When the basic compounds are used as the aqueous solutions or the organic solvent solutions, the concentration thereof is usually from about 1% to about 70% by weight, and preferably from about 10% to about 50% by weight. The reaction temperature is usually from −30° C. to +150° C., preferably from 0° C. to +120° C., and more preferably from +50° C. to +100° C. The reaction can be conducted under any of atmospheric pressure, reduced pressure and increased pressure. Further, the reaction time is usually from 0.1 hour to 24 hours, and preferably from 0.5 hour to 5 hours.

In the cleaning agent for semiconductor parts of the invention, the (co)polymer or a salt thereof is usually dissolved in water and/or a hydrophilic organic solvent (hereinafter also referred to as "a solvent") in an amount of 0.1% to 20% by weight, preferably 1.0% to 10% by weight. When the concentration of the (co)polymer or a salt thereof is less than 0.1% by weight, the cleaning effect is not sufficiently exhibited. On the other hand, in the case of high concentration exceeding 20% by weight, an effect reflecting it is not expected, not economically.

The solvents include hydrophilic organic solvents such as alcohols, ethers and ketones, as well as water. A solvent mainly composed of water, particularly water alone, is preferred among others. Of the above-mentioned hydrophilic organic solvents, specific examples of the alcohols include methanol, ethanol, n-propyl alcohol, i-propyl alcohol, n-butyl alcohol, sec-butyl alcohol, t-butyl alcohol, n-hexyl alcohol, n-octyl alcohol, ethylene glycol, diethylene glycol, triethylene glycol, ethylene glycol monobutyl ether, ethylene glycol monoethyl ether acetate, diethylene glycol monoethyl ether, propylene glycol monomethyl ether, propylene monomethyl ether acetate and diacetone alcohol. Specific examples of the ethers include tetrahydrofuran and dioxane, and specific examples of the ketones include acetone, methyl ethyl ketone, methyl isobutyl ketone and diisobutyl ketone.

These hydrophilic organic solvents can be used either alone or as a combination of two or more of them.

It is preferred that the cleaning agent for semiconductor parts of the invention contains the phosphonic acid compound, in addition to the above-mentioned (co)polymer. The phosphonic acid compound is a low molecular weight compound different from the above-mentioned phosphonic acid (salt) group-containing (co)polymer. The phosphonic acid compounds include phosphonic acid, aminotrimethylenephosphonic acid, 1-hydroxyethylidene-1,1-diphosphonic acid, ethylphosphonic acid, isopropylphosphonic acid, butylphosphonic acid, methylenediphosphonic acid, 1, 1-aminoethanediphosphonic acid, 1,1-hydroxypropanediphosphonic acid, 1,1-aminobutanediphosphonic acid, ethylenediaminetetramethylphosphonic acid, hexamethylenediaminetetramethylphosphonic acid, diethylenetriaminepentamethylphosphonic acid, 2-phosphonoacetic acid, 2-phosphonopropionic acid, 2-phosphonosuccinic acid, 2-phosphonobutane-1,2,4-tricarboxylic acid and salts thereof. Preferred are phosphonic acid, aminotrimethylenephosphonic acid, 1-hydroxyethylidene-1,1-diphosphonic acid, 2-phosphonobutane-1,2,4-tricarboxylic acid and salts thereof. The above-mentioned phosphonic acid compounds can be used either alone or as a combination of two or more of them.

The amount of the phosphonic acid compound to be used is preferably from 0.1% to 100% by weight, and more preferably from 1% to 50% by weight, based on the (co)polymer of the invention.

Less than 0.1% by weight leads to a reduction in metal (ion) removal ability when the (co)polymer is used as the cleaning agent. On the other hand, exceeding 100% by weight results in failure to obtain an effect reflecting it.

In the cleaning agent for semiconductor parts of the invention, it is preferred that at least one kind of surfactant selected from the group consisting of anionic surfactants, cationic surfactants and nonionic surfactants is further mixed with the above-mentioned (co)polymer.

The anionic surfactants include, for example, sulfates of higher alcohols, alkylbenzenesulfonates, aliphatic sulfonates, aliphatic organic acid salts and phosphoric acid surfactants. Preferred are oleates such as ammonium oleate, laureates, rhodinates, dodecylbenzenesulfonates and polyoxyethylene alkyl ether sulfates.

The cationic surfactants include lauryltrimethylammonium chloride, octyltrimethylammonium bromide and dioctyldimethylammonium chloride. Preferred is lauryltrimethylammonium chloride.

The nonionic surfactants usually include alkyl esters such as polyethylene glycol, alkyl ethers such as triethylene glycol monobutyl ether, esters such as polyoxysolbitan ester, and alkylphenols. Preferred is triethylene glycol monobutyl ether.

Further, amphoteric surfactants can also be used as the surfactants. Anionic moieties include ones having carboxylates, sulfates, sulfonates or phosphates, and cationic moieties include ones having amine salts or quaternary ammonium salts.

The amount of the above-mentioned surfactant used is preferably from 0.01% to 5% by weight, more preferably from 0.05% to 2% by weight, and particularly preferably from 0.1% to 1% by weight, based on the (co)polymer of the invention. Less than 0.01% by weight sometimes results in failure to achieve a marked cleaning effect, whereas exceeding 5% by weight results in failure to obtain an effect reflecting the amount added and introduces the problem of foaming in some cases.

In the cleaning agents for semiconductor parts of the invention, it is also possible to use other known cleaning agent components in combination. The other cleaning agent components include, for example, oxalic acid, citric acid, ammonia, hydrogen peroxide, hydrochloric acid and hydrogen fluoride, as well as polyaminocarboxylic acids such as compounds such as ethylenediaminetetraacetic acid (EDTA), trans-1,2-cyclohexanediaminetetraacetic acid (CyDTA), nitrilotriacetic acid (NTA), diethylenetriaminepentaacetic acid (DTPA) and N-(2-hydroxyethyl)ethylenediamine-N,N',N'-triacetic acid (EDTA-OH), and salts thereof. In general, these compounds are used in the form of free acids or salts. For the process of the production of semiconductors, they are preferably used in the form of proton types or salts such as ammonium salts, potassium salts and amine salts. These compounds can be used either alone or as a combination of two or more of them. Although there is no particular limitation on the amount of these compounds, it is usually 5 times or less the weight of the (co)polymers of the invention.

Further, for enhancing the cleaning effect, various alkali solution and functional water such as ozone water or oxidation-reduction water may be used in combination therewith.

The cleaning agents for semiconductor parts of the invention can be used for cleaning the semiconductor parts before and after chemical mechanical polishing (CMP), and are preferably used for removing metallic impurities and abrasive particles left on the semiconductor parts after the CMP. There is no particular limitation on methods for using the cleaning agents, and known methods can be employed. It is also possible to further increase the efficiency of the removal of the metallic impurities by using known cleaning agents, or by conducting known cleaning processes such as immersion cleaning, paddle cleaning, spray cleaning, brush cleaning and ultrasonic cleaning, before or after the cleaning with the cleaning agents of the invention.

Although there is no particular limitation on the pH of the cleaning agents of the invention, it is usually from 1 to 12, preferably from 2 to 10, and more preferably from 3 to 9. The use of the cleaning agents without this range is unfavorable, because the cleaning ability is reduced or metal portions of the equipment are corroded in some cases. The pH can be adjusted by appropriately selecting the kind of counter ion species, or by adding an acid or a base. For example, the pH can be adjusted by changing the ratio of $H^+$ to an alkali component such as an ammonia ion ($NH_3^+$) acting as a counter ion.

The cleaning agents of the invention are usually used at a temperature of 5° C. to 50° C.

The cleaning agents for semiconductor parts of the invention have a high cleaning effect on CMP abrasive particles such as silica and alumina, metallic impurities contained in the CMP slurry, or impurities such as Fe, Mn, Al, Ce, Cu, W and Ti derived from metallic wiring, these which are left on the semiconductor parts after the CMP. They are therefore useful for cleaning the semiconductor parts such as semiconductor substrates, interlayer insulation films and metallic wiring.

Further, the method for cleaning the semiconductor parts using the cleaning agents of the invention reduces a load on the environment. Furthermore, the cleaning method of the invention can efficiently remove metallic impurities left on the semiconductor parts after the CMP.

The invention will be illustrated with reference to examples in more detail below, but the following examples are not intended to limit the scope of the invention. Percentages and parts in examples are on a weight basis, unless otherwise specified.

Various measurements in examples were made as follows:

Weight Average Molecular Weight

The weight average molecular weight (Mw) was obtained by converting results determined by gel permeation chromatography (GPC), using a calibration curve prepared using sodium poly(styrenesulfonate) as a standard sample. The measurement conditions of GPC were as follows:

Column; (1) G3000PWXL (manufactured by TOSOH CORPORATION, Japan)

Column; (2) GMPWXL (manufactured by TOSOH CORPORATION, Japan)

Column; (3) GMPWXL (manufactured by TOSOH CORPORATION, Japan)

Columns (1) to (3) were connected in series in this order, and a sample was introduced from the side of column (1).

Detector; Differential refractometer RI-8021 (manufactured by TOSOH CORPORATION, Japan)

Eluent; Water/acetonitrile/sodium sulfate=2,100/900/15 (ratio by weight)

Flow Rate; 1.0 ml/minute

Temperature; 40° C.

Sample Concentration; 0.2%

Amount of Sample Injected; 400 µl

Particle Removal Ability (Cleaning Evaluation)

Silicon wafers were immersed in a CMP slurry (trade name: CMS1102, manufactured by JSR Corporation, Japan) for 10 minutes, followed by washing with water. The number of contaminant particles adhered to each wafer after washing with water was 40,000 particles/6-inch wafer. The wafers were each immersed in various cleaning agents for 10 minutes, and washed with water. Then, the number of particles adhered onto each wafer (particles/6-inch wafer) was counted. The number of particles was counted with Surfscan 6420 manufactured by KLA Tencor Corporation. The number of particles adhered onto each wafer was evaluated on the following basis, and taken as the particle removal ability.

○: Less than 100 (particles/6-inch wafer)

Δ: 100 to 300 (particles/6-inch wafer)

×: Exceeding 300 (particles/6-inch wafer)

Reference Example 1

A 35% aqueous solution of hydrogen peroxide (25 g) was dissolved in 175 g of a 40% aqueous solution of potassium 2-methyl-1,3-butadiene-1-sulfonate, 287 g of a 80% aqueous solution of acrylic acid and 90 g of water. The resulting solution was equally added dropwise into a vessel with an internal volume of 2 liters charged with 350 g of water, with stirring under reflux for 10 hours. After the dropwise addition was finished, the resulting solution was kept under reflux for 2 hours to obtain a potassium salt (P-1) of a 2-methyl-1,3-butadiene-1-sulfonic acid/acrylic acid (10/90 by molar ratio) copolymer. The weight average molecular weight of the copolymer salt thus obtained was 10,000.

Reference Example 2

A potassium salt (P-2) of an acrylamido-2-methylpropanesulfonic acid/itaconic acid (24/76 by molar ratio) copolymer was obtained in the same manner as with Reference Example 1 with the exceptions that 175 g of the 40% aqueous solution of potassium 2-methyl-1,3-butadiene-1-sulfonate was changed to 500 g of a 20% aqueous solution of potassium acrylamido-2-methylpropanesulfonate, and that 287 g of the 80% aqueous solution of acrylic acid was changed to 662 g of a 30% aqueous solution of itaconic acid. The weight average molecular weight of the copolymer salt thus obtained was 13,000.

Reference Example 3

An ammonium salt (P-3) of a styrenesulfonic acid/methacrylic acid (8/92 by molar ratio) copolymer was obtained in the same manner as with Reference Example 1 with the exceptions that 175 g of the 40% aqueous solution of potassium 2-methyl-1,3-butadiene-1-sulfonate was changed to 250 g of a 20% aqueous solution of ammonium styrenesulfonate, and that 287 g of the 80% aqueous solution of acrylic acid was changed to 312 g of a 80% aqueous solution of methacrylic acid. The weight average molecular weight of the copolymer salt thus obtained was 15,000.

Reference Example 4

A potassium salt (P-4) of a 2-methyl-1,3-butadiene-1-sulfonic acid/itaconic acid (26/74 by molar ratio) copolymer was obtained in the same manner as with Reference Example 1 with the exceptions that 175 g of the 40% aqueous solution of potassium 2-methyl-1,3-butadiene-1-sulfonate was changed to 250 g of the same aqueous solution, and that 287 g of the 80% aqueous solution of acrylic acid was changed to 666 g of a 30% aqueous solution of itaconic acid. The weight average molecular weight of the copolymer salt thus obtained was 13,000.

Reference Example 5

A potassium salt (P-5) of a 2-methyl-1,3-butadiene-1-sulfonic acid polymer was obtained in the same manner as with Reference Example 1 with the exceptions that 175 g of the 40% aqueous solution of potassium 2-methyl-1,3-butadiene-1-sulfonate was changed to 550 g of the same aqueous solution, and that 287 g of the 80% aqueous solution of acrylic acid was not used. The weight average molecular weight of the polymer salt thus obtained was 10,000.

Reference Example 6

An acrylic acid polymer (P-6) having ($H^+$) as a counter ion was obtained in the same manner as with Reference Example 1 with the exceptions that 175 g of the 40% aqueous solution of potassium 2-methyl-1,3-butadiene-1-sulfonate was not used, and that 287 g of the 80% aqueous solution of acrylic acid was changed to 400 g of the same aqueous solution. The weight average molecular weight of the polymer salt thus obtained was 15,000.

EXAMPLES 1 TO 3

Silicon wafers with silicon oxide films were immersed in an aqueous solution of ferric nitrate to previously contaminate them, and the concentration of Fe on the surfaces of the wafers was measured with a total reflection X-ray fluorescence spectrometer. The concentration of Fe on the surface was $15,000 \times 10^{10}$ (atoms/cm$^2$). Then, the contaminated wafers were each washed in 1% (Example 1), 5% (Example 2) and 10% (Example 3) aqueous solutions of the copolymer salt (P-1) of Reference Example 1, respectively, at 40° C. for 3 minutes, followed by washing with pure water and drying. Then, the concentration of Fe on the surfaces of the wafers was measured again to evaluate the Fe removal ability. Results thereof are shown in Table 1.

EXAMPLES 4 TO 18

The wafers were cleaned in the same manner as with Examples 1 to 3 with the exception that (co)polymers (salts) and concentrations thereof shown in Table 1 were used. Results thereof are shown in Table 1.

Comparative Example 1

The wafer was cleaned in the same manner as with Example 3 with the exception that citric acid was used in place of the copolymer salt (P-1). Results thereof are shown in Table 1.

As shown in Table 1, the cleaning agents of the invention are excellent in Fe removal ability.

TABLE 1

|  | (Co)polymer (Salt) | Concentration of (Co)polymer (Salt) (%) | Fe Surface Concentration after Cleaning ($\times 10^{10}$) (atoms/cm$^2$) |
| --- | --- | --- | --- |
| Example 1 | P-1 | 1 | 25 |
| Example 2 | P-1 | 5 | 15 |
| Example 3 | P-1 | 10 | 15 |
| Example 4 | P-2 | 1 | 30 |
| Example 5 | P-2 | 5 | 24 |
| Example 6 | P-2 | 10 | 20 |
| Example 7 | P-3 | 1 | 29 |
| Example 8 | P-3 | 5 | 21 |
| Example 9 | P-3 | 10 | 19 |
| Example 10 | P-4 | 1 | 24 |
| Example 11 | P-4 | 5 | 14 |
| Example 12 | P-4 | 10 | 15 |

TABLE 1-continued

|  | (Co)polymer (Salt) | Concentration of (Co)polymer (Salt) (%) | Fe Surface Concentration after Cleaning ($\times 10^{10}$) (atoms/cm$^2$) |
| --- | --- | --- | --- |
| Example 13 | P-5 | 1 | 100 |
| Example 14 | P-5 | 5 | 80 |
| Example 15 | P-5 | 10 | 75 |
| Example 16 | P-6 | 1 | 50 |
| Example 17 | P-6 | 5 | 30 |
| Example 18 | P-6 | 10 | 25 |
| Comparative Example 1 | Citric acid | 10 | 10,000 |

Reference Example 7

Into a vessel with an internal volume of 2 liters, 100 g of polystyrene was charged, followed by dissolving with 1 liter of 1,2-dichloroethane. After dissolution, 77 g of sulfuric anhydride was added dropwise into the vessel while keeping the internal temperature at 25° C., followed by stirring at 25° C. for 1 hour. Then, water and ammonia were added to give ($NH_3^+$) as a counter ion of the product, and the solvent was removed to obtain an ammonium salt (P-7) of sulfonated polystyrene. The weight average molecular weight of the polymer salt was 10,000.

Reference Example 8

Into a vessel with an internal volume of 3 liters, 100 g of a styrene/2-methyl-1,3-butadiene (20/80 by molar ratio) random copolymer was charged, followed by dissolving with 1 liter of dioxane. After dissolution, sulfuric anhydride/dioxane complex (85 g/500 g) was added dropwise into the vessel while keeping the internal temperature at 25° C., followed by stirring at 25° C. for 1 hour. Then, water and ammonia were added to give ($NH_3^+$) as a counter ion of the product, and the solvent was removed to obtain an ammonium salt (P-8) of a sulfonated product of the styrene/2-methyl-1,3-butadiene (20/80 by molar ratio) random copolymer. The weight average molecular weight of the copolymer salt was 5,000.

Reference Example 9

Into a vessel with an internal volume of 3 liters, 100 g of an AB type block copolymer of styrene/2-methyl-1,3-butadiene (30/70 by molar ratio) was charged, followed by dissolving with 1 liter of dioxane. After dissolution, sulfuric anhydride/dioxane complex (71 g/500 g) was added dropwise into the vessel while keeping the internal temperature at 25° C., followed by stirring at 25° C. for 1 hour to preferentially sulfonate2-methyl-1,3-butadiene units. Then, water was added to give ($H^+$) as a counter ion of the product, and the solvent was removed to obtain a sulfonated product (P-9) of the AB type block copolymer of styrene/2-methyl-1,3-butadiene (30/70 by molar ratio). The weight average molecular weight of the copolymer was 15,000.

Reference Example 10

In a vessel having an internal volume of 2 liters, 14 g of a 35% aqueous solution of hydrogen peroxide was dissolved in 100 g of water, and 500 g of a 20% aqueous solution of styrenesulfonic acid was equally added dropwise thereto with stirring under reflux for 2 hours. After the dropwise addition was finished, the resulting product was kept under reflux for 10 hours. Then, the reaction was finished. Thus, a styrenesulfonic acid polymer (P-10) having (H+) as a counter ion was obtained. The weight average molecular weight of the polymer was 8,000.

Reference Example 11

A potassium salt (P-11) of a 2-methyl-1,3-butadiene-1-sulfonic acid polymer was obtained in the same manner as with Reference Example 10 with the exception that 500 g of the 20% aqueous solution of styrenesulfonic acid was changed to 500 g of a 20% aqueous solution of potassium 2-methyl-1,3-butadiene-1-sulfonate and the counter ion was changed to (K$^+$). The weight average molecular weight of the polymer salt was 15,000.

Reference Example 12

An acrylamido-2-methylpropanesulfonic acid polymer (P-12) having (H$^+$) as a counter ion was obtained in the same manner as with Reference Example 10 with the exception that 500 g of the 20% aqueous solution of styrenesulfonic acid was changed to 500 g of a 20% aqueous solution of acrylamido-2-methylpropanesulfonic acid. The weight average molecular weight of the polymer was 20,000.

Reference Example 13

An acrylamido-2-methylpropanesulfonic acid/itaconic acid (50/50 by molar ratio) copolymer (P-13) having (H$^+$) as a counter ion was obtained in the same manner as with Reference Example 10 with the exception that 500 g of the 20% aqueous solution of styrenesulfonic acid was changed to 305 g of a 20% aqueous solution of acrylamido-2-methylpropanesulfonic acid and 130 g of a 30% aqueous solution of itaconic acid. The weight average molecular weight of the copolymer was 8,000.

Reference Example 14

An ammonium salt (P-14) of 2-methyl-1,3-butadiene-1-sulfonic acid/itaconic acid (85/15 by molar ratio) copolymer was obtained in the same manner as with Reference Example 10 with the exception that 500 g of the 20% aqueous solution of styrenesulfonic acid was changed to 440 g of a 20% aqueous solution of ammonium 2-methyl-1,3-butadiene-1-sulfonate and 40 g of a 30% aqueous solution of ammonium itaconate and the counter ion was changed to (NH$_3^+$). The weight average molecular weight of the copolymer salt was 5,000.

Reference Example 15

An acrylamido-2-methylpropanesulfonic acid/polyoxyethylene monomethacrylate (90/10 by molar ratio) copolymer (P-15) having (H$^+$) as a counter ion was obtained in the same manner as with Reference Example 10 with the exception that 500 g of the 20% aqueous solution of styrenesulfonic acid was changed to 431 g of a 20% aqueous solution of acrylamido-2-methylpropanesulfonic acid and 69 g of a 20% aqueous solution of polyoxyethylene monomethacrylate (5-mole adduct of ethylene oxide). The weight average molecular weight of the copolymer was 15,000.

Reference Example 16

An ammonium salt (P-16) of an acrylamido-2-methylpropanesulfonic acid/acrylic acid (90/10 by molar ratio) copolymer was obtained in the same manner as with Reference Example 10 with the exception that 500 g of the 20% aqueous solution of styrenesulfonic acid was changed to 479 g of a 20% aqueous solution of ammonium acrylamido-2-methylpropane-sulfonate and 21 g of a 20% aqueous solution of ammonium acrylate and the counter ion was changed to (NH$_3^+$). The weight average molecular weight of the copolymer salt was 10,000.

Reference Example 17

An potassium salt (P-17) of an acrylamido-2-methylpropanesulfonic acid/acrylic acid (85/15 by molar ratio) copolymer was obtained in the same manner as with Reference Example 10 with the exception that 500 g of the 20% aqueous solution of styrenesulfonic acid was changed to 64 g of a 20% aqueous solution of potassium acrylamido-2-methylpropane-sulfonate and 7 g of a 20% aqueous solution of potassium acrylate. The weight average molecular weight of the copolymer salt was 10,000.

Reference Example 18

A 2-methyl-1,3-butadiene-1-sulfonic acid/methacrylic acid (95/5 by molar ratio) copolymer (P-18) having (H$^+$) as a counter ion was obtained in the same manner as with Reference Example 10 with the exception that 500 g of the 20% aqueous solution of styrenesulfonic acid was changed to 485 g of a 20% aqueous solution of 2-methyl-1,3-butadiene-1-sulfonic acid and 15 g of a 20% aqueous solution of methacrylic acid. The weight average molecular weight of the copolymer was 10,000.

Reference Example 19

An acrylamido-2-methylpropanesulfonic acid/acrylic acid/hydroxyethyl methacrylate (80/10/10 by molar ratio) copolymer (P-19) having (H$^+$) as a counter ion was obtained in the same manner as with Reference Example 10 with the exception that 500 g of the 20% aqueous solution of styrenesulfonic acid was changed to 458 g of a 20% aqueous solution of acrylamido-2-methylpropanesulfonic acid, 19.5 g of a 20% aqueous solution of acrylic acid and 23 g of a 20% aqueous solution of hydroxyethyl methacrylate. The weight average molecular weight of the copolymer was 9,000.

Reference Example 20

An ammonium salt (P-20) of 2-methyl-1,3-butadiene-1-sulfonic acid/acrylic acid/polyoxyethylene monomethacrylate (90/5/5 by molar ratio) copolymer was obtained in the same manner as with Reference Example 10 with the exception that 500 g of the 20% aqueous solution of styrenesulfonic acid was changed to 443 g of a 20% aqueous solution of ammonium 2-methyl-1,3-butadiene-1-sulfonate, 13 g of a 20% aqueous solution of ammonium acrylate and 44 g of a 20% aqueous ammonium solution of polyoxyethylene monomethacrylate (5-mole adduct of ethylene oxide) and the counter ion was changed to (NH$_3^+$). The weight average molecular weight of the copolymer salt was 15,000.

Reference Example 21

An acrylamido-2-methylpropanesulfonic acid/acrylic acid (50/50 by molar ratio) copolymer (P-21) having (H$^+$) as a counter ion was obtained in the same manner as with Reference Example 10 with the exception that 500 g of the 20% aqueous solution of styrenesulfonic acid was changed to 373 g of a 20% aqueous solution of acrylamido-2-methylpropanesulfonic acid and 127 g of a 20% aqueous solution of acrylic acid. The weight average molecular weight of the copolymer was 12,000.

EXAMPLES 19 TO 33

Silicon wafers with silicon oxide films were immersed in a 3% aqueous solution of KOH, a 3% aqueous solution of $Fe(NO_3)_2$ and a 3% aqueous solution of $CuSO_4$ in this order for 3 minutes, and roughly washed with water, thereby conducting contamination treatment. For the contaminated silicon wafers with silicon oxide films, the concentrations of Cu, Fe and K on the surfaces thereof were measured with a total reflection X-ray fluorescence instrument (instrument name: TREX-610T, manufactured by Tchnos Co., Ltd., Japan). The surface concentrations of Cu, Fe and K were $100 \times 10^{10}$ (atoms/cm$^2$), $15,000 \times 10^{10}$ (atoms/cm$^2$) and $90 \times 10^{10}$ (atoms/cm$^2$), respectively. Then, 2% aqueous solutions of the (co)polymers (salts) of Reference Examples 7 to 21 (P-7 to P-21) were prepared as cleaning agents. The contaminated wafers were washed in the prepared cleaning agents at 40° C. for 3 minutes, followed by washing with pure water and drying. Then, the concentrations of Cu, Fe and K on the surfaces of the wafers were measured again to evaluate the Cu, Fe and K removal ability. Results thereof are shown in Table 2.

EXAMPLE 34

The wafer was cleaned in the same manner as with Example 22 with the exception that triethylene glycol monobutyl ether was added to the 2% aqueous solution of the polymer (P-10) of Reference Example 10 so as to give a concentration of 0.05%. Results thereof are shown in Table 3.

EXAMPLE 35

The wafer was cleaned in the same manner as with Example 23 with the exception that lauryltrimethylammonium chloride was added to the 2% aqueous solution of the polymer salt (P-11) of Reference Example 11 so as to give a concentration of 0.05%. Results thereof are shown in Table 3.

EXAMPLE 36

The wafer was cleaned in the same manner as with Example 24 with the exception that ammonium oleate was added to the 2% aqueous solution of the polymer (P-12) of Reference Example 12 so as to give a concentration of 0.05%. Results thereof are shown in Table 3.

EXAMPLE 37

The wafer was cleaned in the same manner as with Example 32 with the exception that triethylene glycol monobutyl ether was added to the 2% aqueous solution of the polymer (P-17) of Reference Example 17 so as to give a concentration of 0.05%. Results thereof are shown in Table 3.

EXAMPLE 38

The wafer was cleaned in the same manner as with Example 32 with the exception that lauryltrimethylammonium chloride was added to the 2% aqueous solution of the polymer salt (P-17) of Reference Example 17 so as to give a concentration of 0.05%. Results thereof are shown in Table 3.

EXAMPLE 39

The wafer was cleaned in the same manner as with Example 32 with the exception that ammonium oleate was added to the 2% aqueous solution of the polymer (P-17) of Reference Example 17 so as to give a concentration of 0.05%. Results thereof are shown in Table 3.

Comparative Example 2

The wafer was cleaned in the same manner as with Example 19 with the exception that a 10% aqueous solution of citric acid was used in place of the aqueous solution of the polymer of Reference Example 7. Results thereof are shown in Table 3.

Tables 2 and 3 show that the cleaning agents of the invention are more excellent in Cu, Fe and K removal ability and particle removal ability than the cleaning agent used in Comparative Example 2 in which citric acid is used.

TABLE 2

| | Cleaning Agent | | Surface Concentration after Cleaning ($\times 10^{10}$) (atoms/cm$^2$) | | | Particle Removal Ability |
|---|---|---|---|---|---|---|
| | Kind of (Co)polymer (Salt) | Kind of Surfactant | Cu | Fe | K | |
| Example 19 | P-7 | — | 4 | 3 | 2 | ○ |
| Example 20 | P-8 | — | 3 | 3 | 4 | ○ |
| Example 21 | P-9 | — | 2 | 2 | 2 | ○ |
| Example 22 | P-10 | — | 3 | 1 | 2 | ○ |
| Example 23 | P-11 | — | 3 | 2 | 1 | ○ |
| Example 24 | P-12 | — | 3 | 1 | 3 | ○ |
| Example 25 | P-13 | — | 2 | 1 | 3 | ○ |
| Example 26 | P-14 | — | 1 | 1 | 2 | ○ |
| Example 27 | P-15 | — | 3 | 3 | 1 | ○ |
| Example 28 | P-16 | — | 2 | 1 | 1 | ○ |
| Example 29 | P-17 | — | 1 | 1 | 4 | ○ |
| Example 30 | P-18 | — | 2 | 2 | 1 | ○ |
| Example 31 | P-19 | — | 2 | 2 | 2 | ○ |
| Example 32 | P-20 | — | 2 | 1 | 1 | ○ |
| Example 33 | P-21 | — | 9 | 8 | 10 | Δ |

TABLE 3

| | Cleaning Agent | | Surface Concentration after Cleaning ($\times 10^{10}$) (atoms/cm$^2$) | | | Particle Removal Ability |
|---|---|---|---|---|---|---|
| | Kind of (Co)polymer (Salt) | Kind of Surfactant | Cu | Fe | K | |
| Example 34 | P-10 | Triethylene glycol monobutyl ether | 2 | 1 | 1 | ○ |
| Example 35 | P-11 | Lauryltrimethylammonium chloride | 1 | 3 | 1 | ○ |
| Example 36 | P-12 | Ammonium oleate | 1 | 2 | 2 | ○ |
| Example 37 | P-17 | Triethylene glycol monobutyl ether | 1 | 1 | 2 | ○ |
| Example 38 | P-17 | Lauryltrimethylammonium chloride | 3 | 1 | 1 | ○ |
| Example 39 | P-17 | Ammonium oleate | 2 | 1 | 1 | ○ |
| Comparative Example 2 | Citric acid | — | 10 | 15 | 23 | X |

Reference Example 22

A 35% aqueous solution of hydrogen peroxide (14 g) was dissolved in 500 g of a 20% aqueous solution of acrylic acid.

The resulting solution was equally added dropwise into a vessel with an internal volume of 2 liters charged with 1,000 g of water, with stirring under reflux for 10 hours. After the dropwise addition was finished, the resulting product was kept under reflux for 2 hours, followed by neutralization with an aqueous solution of water to give ($NH_3^+$) as a counter ion of the product, thereby obtaining an ammonium salt (P-22) of an acrylic acid polymer. The weight average molecular weight of the polymer salt was 20,000.

Reference Example 23

An ammonium salt (P-23) of an acrylamido-2-methylpropanesulfonic acid polymer was obtained in the same manner as with Reference Example 22 with the exception that 500 g of the 20% aqueous solution of acrylic acid was changed to 500 g of a 20% aqueous solution of acrylamido-2-methylpropanesulfonic acid. The weight average molecular weight of the copolymer salt was 18,000.

Reference Example 24

An itaconic acid polymer (P-24) was obtained in the same manner as with Reference Example 22 with the exception that 500 g of the 20% aqueous solution of acrylic acid was changed to 500 g of a 20% aqueous solution of itaconic acid and the counter ion was changed to ($H^+$). The weight average molecular weight of the polymer was 3,000.

Reference Example 25

A styrenesulfonic acid polymer (P-25) was obtained in the same manner as with Reference Example 22 with the exception that 500 g of the 20% aqueous solution of acrylic acid was changed to 500 g of a 20% aqueous solution of styrenesulfonic acid and the counter ion was changed to ($H^+$). The weight average molecular weight of the polymer was 14,000.

Reference Example 26

A vinylphosphonic acid polymer (P-26) was obtained in the same manner as with Reference Example 22 with the exception that 500 g of the 20% aqueous solution of acrylic acid was changed to 500 g of a 20% aqueous solution of vinylphosphonic acid and the counter ion was changed to ($H^+$). The weight average molecular weight of the polymer was 3,000.

EXAMPLES 40 TO 45

Silicon wafers with silicon oxide films were immersed in a 3% aqueous solution of KOH, a 3% aqueous solution of $Fe(NO_3)_2$ and a 3% aqueous solution of $CuSO_4$ in this order for 3 minutes, and roughly washed with water, thereby conducting contamination treatment. For the contaminated silicon wafers with silicon oxide films, the concentrations of Cu, Fe and K on the surfaces thereof were measured with a total reflection X-ray fluorescence instrument (instrument name: TREX-610T, manufactured by Tchnos Co., Ltd., Japan). The surface concentrations of Cu, Fe and K were $100 \times 10^{10}$ (atoms/$cm^2$), $15,000 \times 10^{10}$ (atoms/$cm^2$) and $90 \times 10^{10}$ (atoms/$cm^2$), respectively. Then, 2% aqueous solutions containing the (co)polymers (salts) of Reference Examples 22 to 26 (P-22 to P-26) at ratios shown in Table 4 and 0.2% aqueous solution containing phosphonic acid compounds shown in Table 4 were prepared as cleaning agents. The contaminated wafers were washed in the prepared cleaning agents at 40° C. for 3 minutes, followed by washing with pure water and drying. Then, the concentrations of Cu, Fe and K on the surfaces of the wafers were measured again to evaluate the Cu, Fe and K removal ability. Results thereof are shown in Table 4.

Comparative Example 3

The wafer was cleaned in the same manner as with Example 40 with the exception that citric acid was used at a concentration of 10% in place of the copolymer without using a phosphonic acid. Results thereof are shown in Table 4.

Comparative Example 4

The wafer was cleaned in the same manner as with Example 45 with the exception that the copolymer of the invention was not used. Results thereof are shown in Table 4.

Table 4 shows that the cleaning agents of the invention are more excellent in Cu, Fe and K removal ability and particle removal ability than the cleaning agents used in Comparative Examples 3 and 4.

TABLE 4

| | (Co)polymer (Salt) | | Kind of Phosphonic Acid Compound | Surface Concentration after Cleaning ($\times 10^{10}$) (atoms/$cm^2$) | | | Particle Removal Ability |
|---|---|---|---|---|---|---|---|
| | Kind | Ratio | | Cu | Fe | K | |
| Example | | | | | | | |
| 40 | P-22/P-23 | 5/5 | — | 0.8 | 0.9 | 0.9 | ○ |
| 41 | P-24/P-25/P-26 | 4/4/2 | — | 1 | 0.8 | 0.8 | ○ |
| 42 | P-22/P-26 | 9/1 | — | 0.8 | 0.9 | 0.9 | ○ |
| 43 | P-23/P-24 | 3/7 | — | 0.9 | 0.8 | 0.9 | ○ |
| 44 | P-22/P-23 | 5/5 | Aminotri(methylenephosphonic acid) | 0.8 | 0.7 | 0.7 | ○ |
| 45 | P-22/P-23 | 5/5 | 1-Hydroxyethylidene-1,1-diphosphonic Acid | 0.7 | 0.7 | 0.7 | ○ |

TABLE 4-continued

| | (Co)polymer (Salt) | | Kind of Phosphonic Acid Compound | Surface Concentration after Cleaning (×10$^{10}$) (atoms/cm$^2$) | | | Particle Removal Ability |
|---|---|---|---|---|---|---|---|
| | Kind | Ratio | | Cu | Fe | K | |
| Comparative Example | | | | | | | |
| 3 | Citric acid | — | — | 10 | 15 | 23 | X |
| 4 | — | — | 1-Hydroxyethylidene-1,1-diphosphonic Acid | 12 | 10 | 15 | X |

What is claimed is:

1. A method for cleaning a semiconductor part comprising:
    contacting said seminconductor part with a cleaning agent for semiconductor parts, said cleaning agent comprising a (co)polymer having at least one group selected from the group consisting of sulfonic acid (salt) group and carboxylic acid (salt) group; and
    cleaning the semiconductor part with the cleaning agent.

2. The method according to claim 1, in which said (co)polymer is obtained by (co)polymerizing at least one monomer selected from the group consisting of sulfonic acid (salt) group-containing monomers (a) and carboxylic acid (salt) group-containing monomers (b).

3. The method according to claim 2, in which said carboxylic acid (salt) group-containing monomer (b) is itaconic acid or a salt thereof.

4. The method according to claim 2, in which the ratio of the carboxylic acid group-containing monomer (b) contained in said (co)polymer is less than 20 mole percent.

5. The method according to claim 1, in which said sulfonic acid (salt) group-containing monomer (a) is at least one monomer selected from the group consisting of 2-methyl-1,3-butadiene-1-sulfonic acid and salts thereof, (meth)acrylamido-2-methylpropanesulfonic acid and salts thereof, and 2-methyl-1,3-butadiene-1-sulfonic acid and salts thereof.

6. The method according to claim 1, in which said (co)polymer is a copolymer having a block structure.

7. The method according to claim 1, in which said (co)polymer further comprises a (co)polymer in which at least monomer (c) selected from the group consisting of phosphonic acid (salt) group-containing monomers, hydroxyl group-containing monomers, monomers having skeletons derived from ethylene oxide and monomers having skeletons derived from propylene oxide is copolymerized.

8. The method according to claim 1, in which said cleaning agent further contains a phosphonic acid compound.

9. The method according to claim 1, in which said cleaning agent further contains at least one surfactant selected from the group consisting of anionic surfactants, cationic surfactants and nonionic surfactants.

10. A method for cleaning a semiconductor part, comprising:
    optionally cleaning said semiconductor part with a cleaning agent for semiconductor parts, said cleaning agent comprising a (co)polymer having at least one group selected from the group consisting of sulfonic acid (salt) group and carboxylic acid (salt) group;
    chemical mechanical polishing the semiconductor part;
    optionally cleaning the chemical mechanical polished semiconductor part with the cleaning agent; wherein
    at least one of the cleaning steps is carried out.

11. The method according to claim 10, in which said (co)polymer is obtained by (co)polymerizing at least one monomer selected from the group consisting of sulfonic acid (salt) group-containing monomers (a) and carboxylic acid (salt) group-containing monomers (b).

12. The method according to claim 11, in which said carboxylic acid (salt) group-containing monomer (b) is itaconic acid or a salt thereof.

13. The method according to claim 11, in which the ratio of the carboxylic acid group-containing monomer (b) contained in said (co)polymer is less than 20 mole percent.

14. The method according to claim 10, in which said sulfonic acid (salt) group-containing monomer (a) is at least one monomer selected from the group consisting of 2-methyl-1,3-butadiene-1-sulfonic acid and salts thereof, (meth)acrylamido-2-methylpropanesulfonic acid and salts thereof, and 2-methyl-1,3-butadiene-1-sulfonic acid and salts thereof.

15. The method according to claim 10, in which said (co)polymer is a copolymer having a block structure.

16. The method according to claim 10, in which said (co)polymer further comprises a (co)polymer in which at least monomer (c) selected from the group consisting of phosphonic acid (salt) group-containing monomers, hydroxyl group-containing monomers, monomers having skeletons derived from ethylene oxide and monomers having skeletons derived from propylene oxide is copolymerized.

17. The method according to claim 10, in which said cleaning agent further contains a phosphonic acid compound.

18. The method according to claim 10, in which said cleaning agent further contains at least one surfactant selected from the group consisting of anionic surfactants, cationic surfactants and nonionic surfactants.

* * * * *